United States Patent [19]

Wu

[11] Patent Number: 5,828,082

[45] Date of Patent: *Oct. 27, 1998

[54] THIN FILM TRANSISTOR HAVING DUAL INSULATION LAYER WITH A WINDOW ABOVE GATE ELECTRODE

[75] Inventor: Biing-Seng Wu, Hsinchu, Taiwan

[73] Assignee: Industrial Technology Research Institute, Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 810,094

[22] Filed: Mar. 3, 1997

Related U.S. Application Data

[63] Continuation of Ser. No. 431,610, Apr. 28, 1995, abandoned, which is a continuation of Ser. No. 875,651, Apr. 29, 1992, abandoned.

[51] Int. Cl.$^6$ .................................................. H01L 29/04
[52] U.S. Cl. .................................. 257/57; 257/59; 257/66
[58] Field of Search ................................ 257/57, 59, 60, 257/66, 61, 72

[56] References Cited

U.S. PATENT DOCUMENTS

| | | | |
|---|---|---|---|
| 4,651,185 | 3/1987 | Holmberg et al. | 257/60 |
| 4,778,773 | 10/1988 | Sukegawa | 257/57 |
| 5,294,811 | 3/1994 | Aoyama et al. | 257/59 |

FOREIGN PATENT DOCUMENTS

| | | | |
|---|---|---|---|
| 61-247072 | 11/1986 | Japan | 257/60 |

OTHER PUBLICATIONS

Yamamoto et al., "A New a–Si TFT with Al$_2$O$_3$/SiN Double––Layered Gate Insolator for 10.4–inch Diagonal Multicolor Display," IEDM 90–851, pp. 851–854, 1990.

Sakamoto et al., "A 10–in Diagonal Active–Mutrix LCD Addressed by a–Si TFTs," Proceedings of the SID, vol. 28/2, 1987, pp. 145–148.

Akiyama et al., "An a–Si TFT with A New Light–Shield Structure And Its Application To Active–Matrix Liquid Crystal Displays," IEDM 88–268, pp. 268–271, 1988.

Katoh, "TFT–LCD Technology Achieves Color Notebook PC," Nikkei Electronics Asia, Apr. 1992, pp. 68–71.

Nanno et al., "High Resolution 6–inch LCD using a–Si TFT with TaO$_x$/SiN$_x$ double insulating layer," *Displays*, Jan. 1990, pp. 36–40.

*Primary Examiner*—Jerome Jackson
*Assistant Examiner*—Nathan K. Kelley
*Attorney, Agent, or Firm*—George O. Saile; Stephen B. Ackerman; Graham S. Jones, II

[57] ABSTRACT

An additional high quality insulating layer is grown over the substrate after the formation of the gate electrode of a thin film transistor (TFT). The growth temperature of the insulating layer can be higher than conventional method and the insulating layer is more free of pin-holes. After the insulating layer in the thin oxide region of the TFT is etched away, conventional fabrication processes are followed. The dielectric of the thin film oxide region is the same as that of the conventional TFT; but the dielectric in the vicinity of the thin oxide region, the crossovers of the data lines and the scan lines, and the gate dielectric layer of the TFT are now composed of the high quality insulating layer. The TFT structure can improve the yield of fabrication by confining the channel region in the shadow of the gate electrode to reduce the leakage photo-current, and by reducing the steps at cross-overs steps and interconnections to avoid open-circuit.

12 Claims, 15 Drawing Sheets

| | TYPE A | TYPE B | TYPE C |
|---|---|---|---|
| mask layers (TFT) | 4 | 4 | 4 |
| etching stopper | no | no | yes |
| a-Si thickness | > 2000A | > 2000A | 500A |
| photocurrent | high | no | low |
| dark leak | < 1 pA | 10 pA | < 1pA |
| yield | M | L | H |
| TFT size | S | S | M |

FIG. 1E

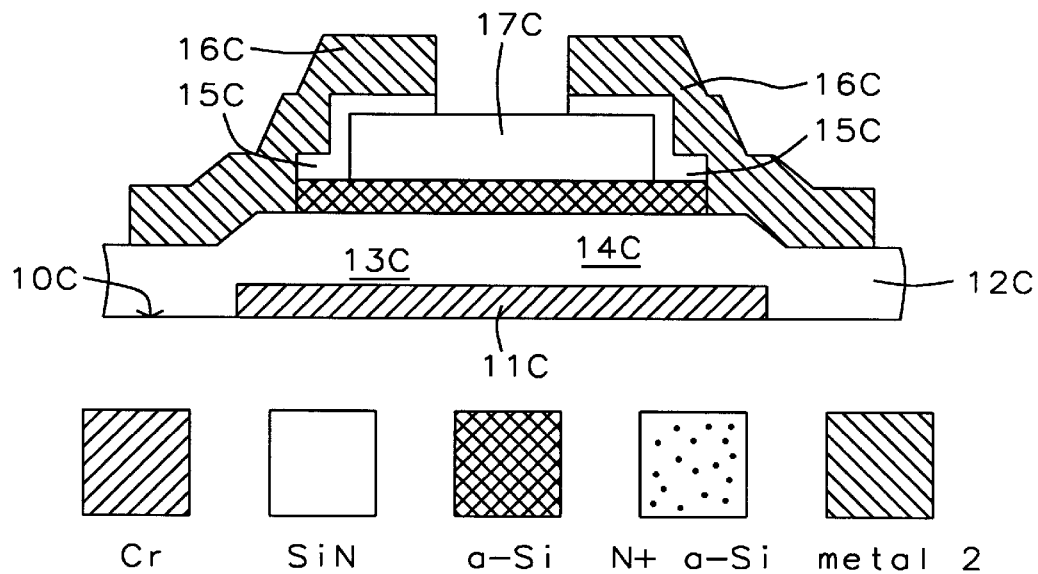
FIG. 5 — Prior Art
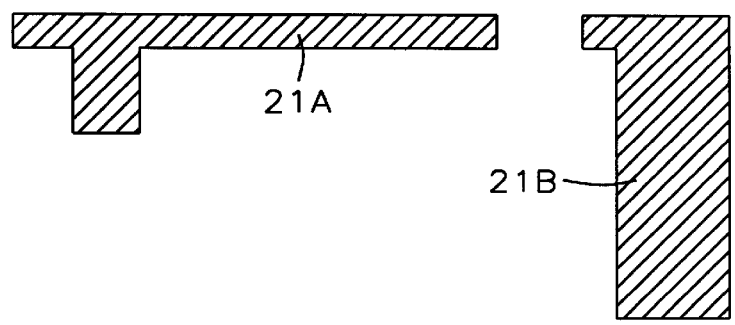
FIG. 6A 5,828,082

THIN FILM TRANSISTOR HAVING DUAL INSULATION LAYER WITH A WINDOW ABOVE GATE ELECTRODE

This application is a continuation of U.S. patent application Ser. No. 08/431,610 filed on Apr. 28, 1995, now abandoned, which is a continuation of U.S. patent application Ser. No. 07/875,651 filed on Apr. 29, 1992 now abandoned.

BACKGROUND

This invention relates to thin film transistors (TFT), in particular to TFT for use in active matrix liquid crystal display (LCD).

TFTs are widely used for LCD panels. In such a TFTLCD system, each picture element (pixel) has LCD device and a switch to turn the LCD device on and off. A matrix of pixels are placed at the cross-points of a number of rows of sequential scan signals and a number of columns of data signals. When a scan signal and a data signal is coincident at a certain cross-point, the pixel at that particular cross-point is activated. The coincident addressing of this particular pixel is accomplished by a TFT, where the scan signal may be applied to the gate of the TFT and the data signal may be impressed on the drain of the TFT and driving the corresponding LCD from the source of the TFT.

There are a number of structures for TFTs as described in a paper by M. Akiyama et al, "An a-Si TFT with a New Light-Shield Structure and Its Application to Active Matrix Liquid Crystal Displays" *IEEE International Electron Devices Meeting Proceedings,* Dec. 1988, pp. 268–271. In general, FIGS. 1A to 1B show the cross-sectional views of the conventional amorphous silicon (a-Si) TFTs. The table under the cross-sectional views is the comparison among the different kinds of TFTs.

The fabrication processes of type A and type B a-Si TFTs are as follows: (1). Deposit a metal film as the gate of the TFT on a transparent substrate. (2) Deposit a-Si, silicon nitride (a-SiN), heavily-doped a-Si (n+ a-Si) films on the substrate. (3) Etch the n+a-Si and a-Si films except the active region of the TFT by the standard photolithographic processes and dry etching. (4) Open the contact holes of the TFTs. (5) Form the source and drain contact metal of the TFT. (6) Etch the n+a-Si layer between the source and the drain electrodes by dry etching. Because there is no etching stopper in the type A and type B TFTs, step 6 is controlled by the etching time, which is critical, and the thickness of the a-Si layer must be much thicker than that of the n+a-Si layer. Typically, the thickness of the a-Si layer is more than 2000 Angstroms. Type A and type B TFTs have the same structure except that in the type A TFT, the a-Si layer protrudes beyond both edges of the gate electrode, as described by Sakamoto et al in paper, "A 10-In.-DIAGONAL ACTIVE-MATRIX LCD ADDRESSED BY a-Si TFTs", *Proceedings of the SID,* Vol. 28/2, 1987, pp. 145–148. In the type B TFT the a-Si layer is located completely inside the shadow of of the gate electrodes. When this device is operated in the back gate illumination condition, leakage current is observed in the type A structure, because carriers are generated in the illuminated protruded region due to photoelectric effect. Thus, the type A TFT cannot be used in the TFTLCD. For the type B structure, the a-Si layer is totally shielded by the gate electrode. Thus, there is no photocurrent when it is operated in the back gate illumination condition. However, during the fabrication, the a-SiN layer, i.e. the gate insulating layer, beyond the active region is attacked during the N-a-Si and a-Si etching step (Step 3). Therefore, the yield of the type B structure is very poor when it is used for the TFTLCD which is a matrix array of a large number of pixels.

In order to improve the yield of the TFT, an a-Si TFT which has a second layer of a-SiN has been developed as shown in FIG. 1(c). The fabrication process of the type C device is similar to that of type A and type B., except that the top nitride (a-SiN) layer is deposited after the deposition of the a-Si film and the top a-SiN film and the top a-SiN layer is removed from the source and drain contact regions before the deposition of the n+a-Si layer. The top a-SiN layer remains in the channel region of the transistor, and can be used as the etching stopper during etching of the n$^+$a-Si layer between the source and drain electrodes because the SiN is resistant to Si etch. The thickness of the a-Si layer can be made very thin, typically less than 500 Angstroms. Due to the low photon absorption in the thin a-Si layer, the a-Si layer can protrude outside both the edges of the gate electrode without incurring substantial amount of leakage current. Since the gate insulating a-SiN layer is not attacked during the formation of the active region, the type C device has a higher manufacturing yield than the type B device.

In the type A and type B devices, the channel length is equal to the space between the source and the drain electrodes. In the type C device, the channel length is equal to the length of the top a-SiN and is longer than the space between the source-drain electrodes. Thus, if the same design rule is used, the channel length of the type C device must be longer than that of type A or type B devices. Thus, the type C device occupies a large area, and is not suitable for high resolution displays. The detailed discussion of this effect is described in a paper by H. Katoh, "TFT-LCD Technology Achieves Color Notebook PC", *Nikkei Electronics ASIA,* April, pp. 68–71, 1992.

SUMMARY

An object of this invention is to construct a thin film transistor (TFT for active matrix liquid crystal display which is free from leakage photocurrent due to backside illumination. Another object of this invention is to construct a TFT, which is smaller than conventional TFT. A further object of this invention is to construct a TFT with a high yield process.

These objects are achieved in this invention by adding an insulating layer on the gate before the a-Si layer is deposited. Thus, this insulating layer can be grown at a high temperature, and free from pin holes. The a-Si layer is shielded by the gate electrode to reduce the generation of leakage photocurrent and to reduce the geometry of the structure. The structure also reduces the step at the interconnection crossings to avoid breakage. These effects improve the fabrication yield of TFT liquid crystal display panels.

BRIEF DESCRIPTION OF THE DRAWINGS

FIGS. 1A to 1E show the structures of conventional thin film transistors.

FIG. 5 shows the cross section of a prior art TFT.

FIGS. 6(a) through 6(g) show the masks for fabricating the TFT of the present invention.

DETAILED DESCRIPTION OF THE PREFERRED EMBODIMENT

Figure 1A:
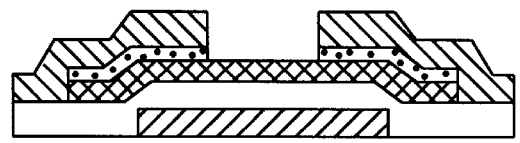
Figure 1B:
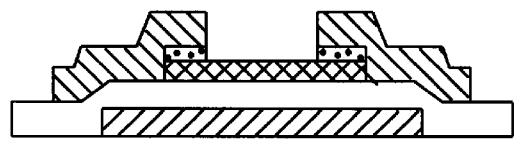

FIGS. 8A to 8E shows the process flow of our invention for fabricating a high yield a-Si TFT. The process includes the following steps:

(a) Deposit and pattern a gate electrode 11 on a transparent insulating substrate 10. The preferred material is Cr.

(b) Deposit a first insulating layer 12 on the substrate 10.

(c) Deposit and develop a photoresist layer to open a channel window above the gate electrode 11 and smaller than the gate electrode 11 for a channel region of the TFT.

(d) Etch the first insulating layer through the channel window in the photoresist layer until the gate metal is bare below the channel window. At the same time, open the contact holes for the gate electrode and the scan lines.

(e) Deposit a conformal silicon nitride (a-SiN) film 13 (second insulating layer and a conformal amorphous silicon (a-Si) film 14 and a conformal heavily doped N+ amorphous silicon (N+ a-Si) semiconductor film 15 on the substrate 10.

(f) Etch the n+ a-Si film 15 and a-Si film 14 films except in the active region of the TFT by standard photographic processes and dry etching. Both N+ a-Si film 15 and a-Si film 14 are patterned to form an island with a length aligned with the gate electrode 11, but shorter than the gate electrode 11 and serving as the source region, the drain region and the channel for the TFT. The N+ a-Si film 15 and a-Si film 14 are thus patterned into a self-aligned island above the second insulating layer 13 not aligned with the gate electrode 11.

(g) Open contact holes of the TFT array through the gate insulator.

(h) Form the source and drain contact metal 16 of the TFT.

(i) Etch the n+a-Si layer between the source and the drain electrodes 16 by dry etching a hole in the N+ a-Si film 15 above gate electrode 11 forming source/drain regions in N+ a-Si film 15.

Figure 1C:
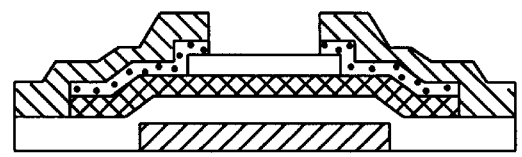
Figure 1D:
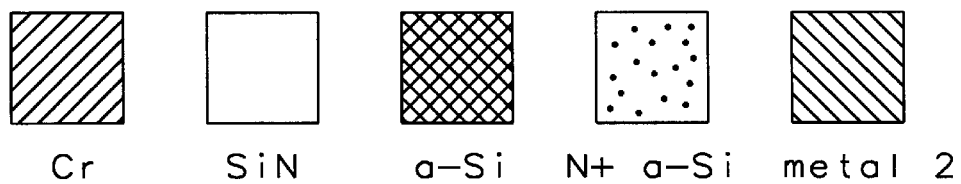

This invention has the same number of mask layers as the type C TFT in FIG. 1C. However, the structure of this invention has the following advantages over the type C TFT:

(1) The first insulating layer 12, as compared with the type C TFT, can be deposited at high temperatures (>400° C.) and has a better quality than the a-SiN, which is deposited at a lower temperature (250° C.). The top a-SiN film of the type C device is deposited after the a-Si film. The deposition temperature of the a-Si film is about 250° C. If the deposition temperature of the top a-SiN film is higher than the deposition temperature of the a-Si film, the deposited a-Si film is degraded or damaged during the a-SiN deposition process. Thus, the integrity (i.e.,freedom from pin holes) of the first insulating layer of this invention is better than that of the type C device, and hence the fabrication yield of the new TFT is better than the prior art.

Figure 3A:
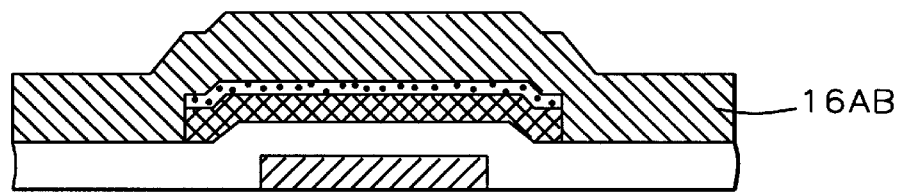
FIGS. 3A–3C show the cross-sectional view of cross-overs of the data line and the scan line of a LCD using the conventional TFTs and the TFT of the present invention.
Figure 3B:
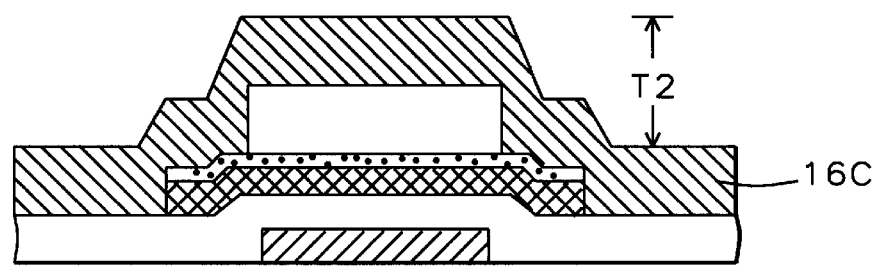
Figure 3C:
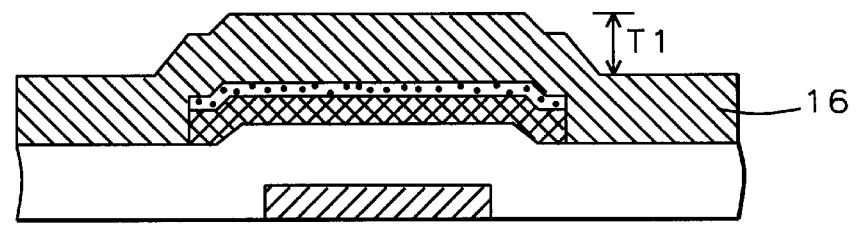
Figure 4A:
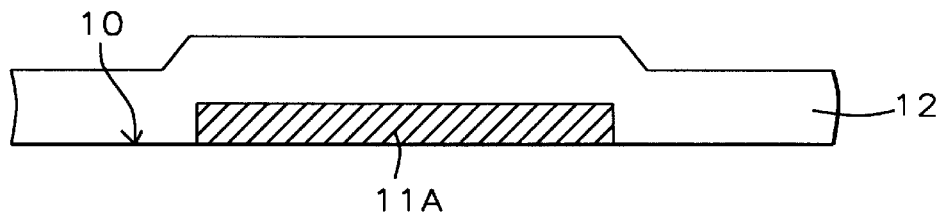
FIGS. 4A–4D show the cross-sectional view of the contacts for the present invention.
Figure 4B:
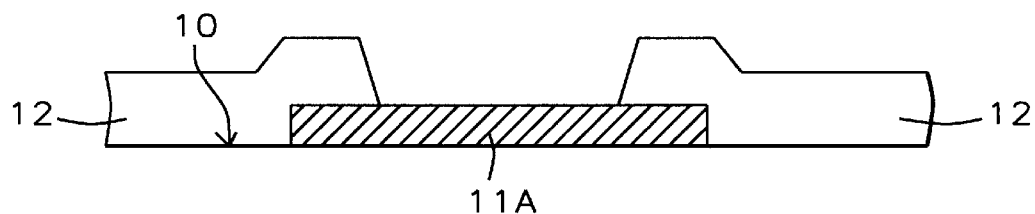
Figure 4C:
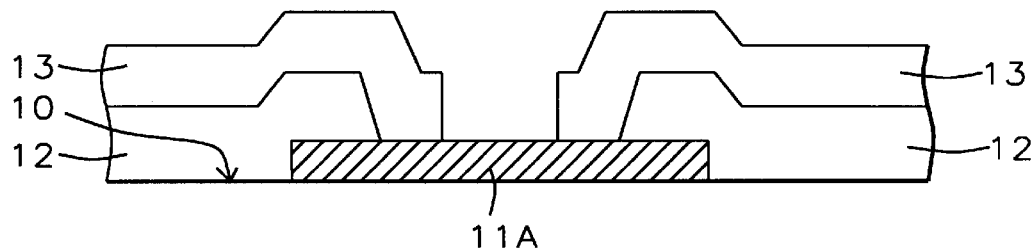
Figure 4D:
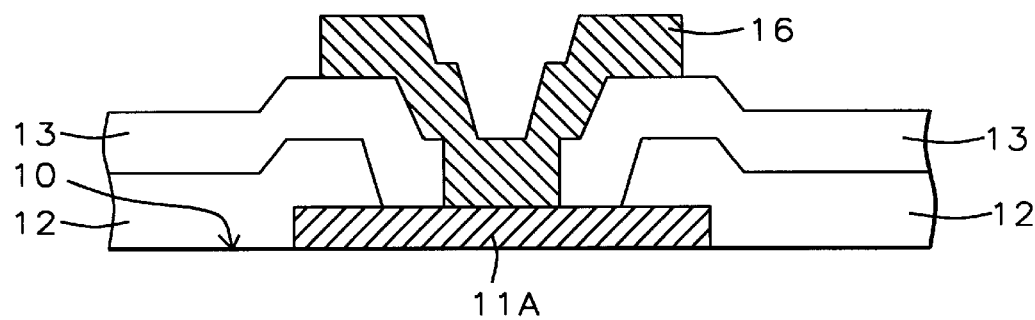

(2) The cross-sectional views of the crossovers of the data lines and the scan lines of the TFTLCD is shown in FIG. 3. Neglecting the step caused by metal 1 (Cr), note that type A, type B and this invention have only one step T1 for the data line (metal 2, Al). However, the type C structure has two steps T2 for the data line 16C. Thus the yield of the continuity without breakage at the step of the data lines in this new structure is no worse than the type A and type B devices. Actually, the yield can be better than the type A and type B structures, because the step caused by the metal 1 step is improved by the use of multilayers, i.e., the first insulating layer 12 and the gate insulator 13.

(3) The use of two step contact holes improves the yield for this invention, as shown in FIGS. 4A to 4D. The contacts llA are located at the periphery of this display area, where the design rule is non-critical, e.g. larger than 100 $\mu$m×100 $\mu$m. Therefore the design of the contact hole is not critical.

(4) An important advantage of this invention is that the leakage photocurrent is less than that of the type A device, and is suitable for projection television which uses the TFTLCD panel as the light valve. Some manufacturers use the the type C Prior art device for this purpose, as shown in FIG. 5. In FIG. 5, the substrate 10C and the films 12C, 13C, 14C ,15C and 16C correspond to substrate 10, films 12, 13, 14, 15 and 16 in FIGS. 2A to 2D and FIGS. 2E to 2G respectively. The a-Si film 14C is located entirely inside the shadow of the gate electrode 11C. However, the "weak point" of the type C TFT is at the edge of the source-drain electrodes, which occupies a larger area.

Figure 2A:
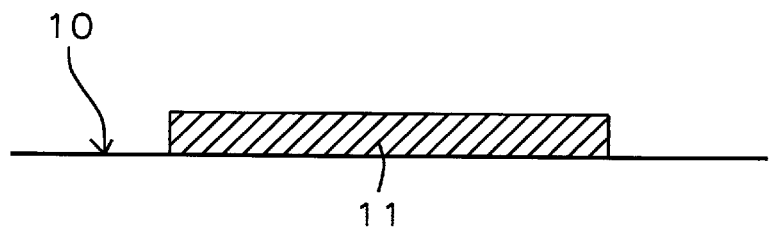
FIGS. 2(A)–2(D) show the first four steps in fabricating the TFT structure of the present invention.
Figure 2B:
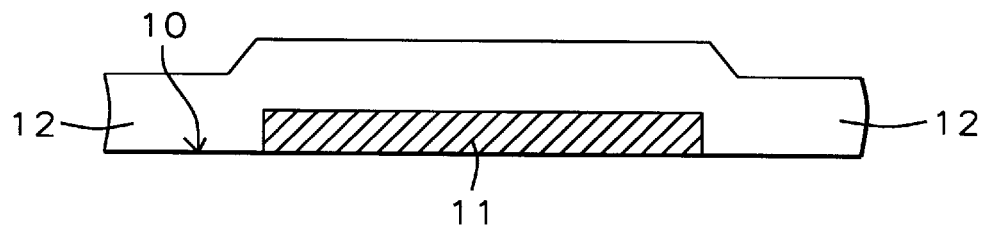
Figure 2C:
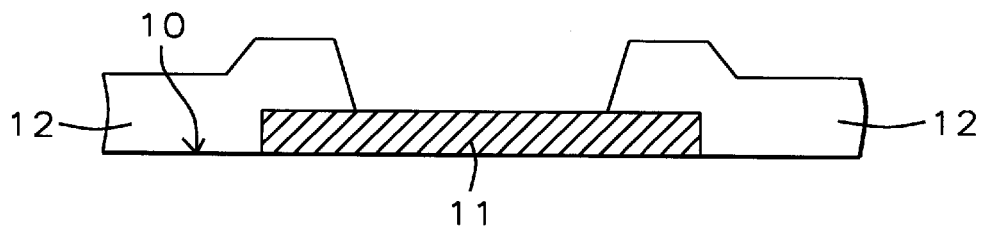
Figure 2D:
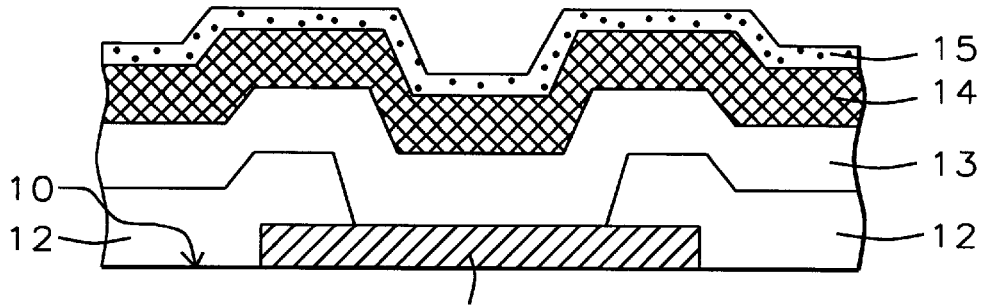
Figure 2E:
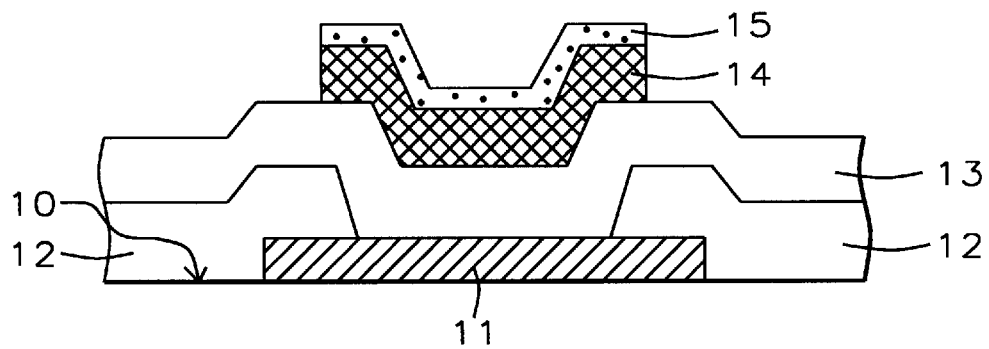
FIGS. 2E–2G show the next three steps in fabricating the TFT structure.
Figure 2F:
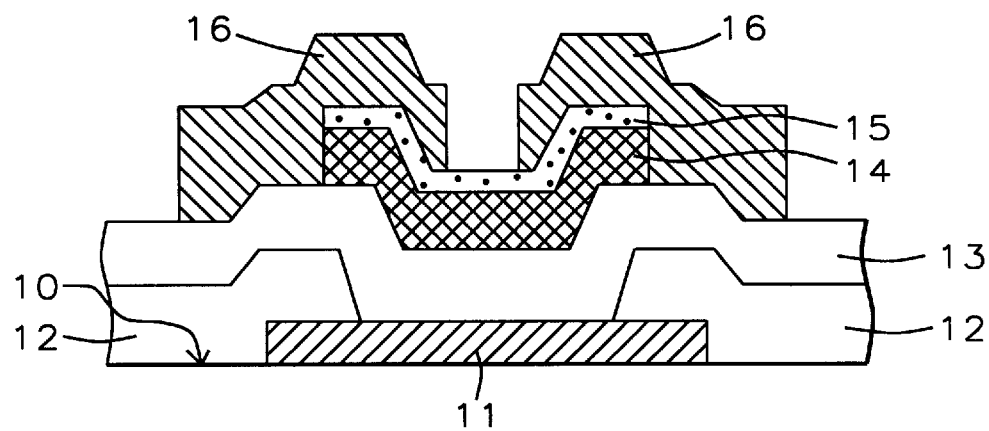
Figure 2G:
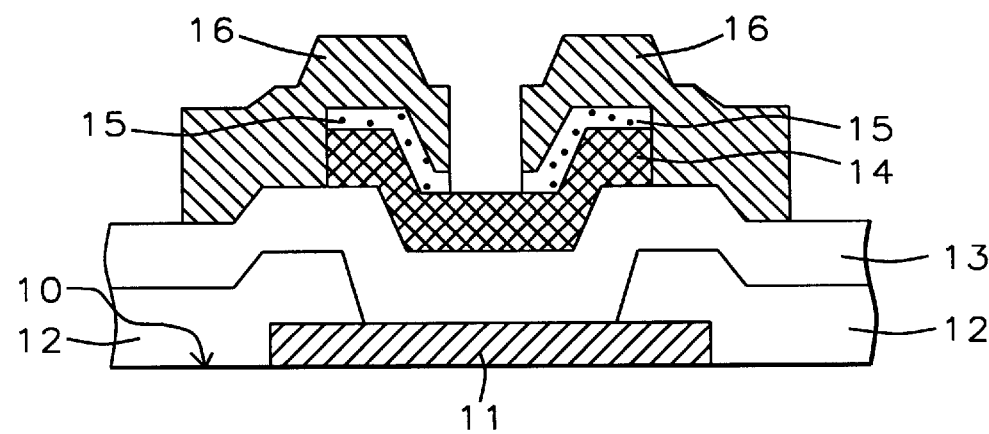

(5) The channel length of the TFT of this invention is equal to the space between the source electrode and the drain electrode, as shown in FIGS. 2E to 2G, cross-section (i). In the type C device, the length of the channel 14C is equal to the length of the top a-SiN layer and is longer than the space between the source and drain electrodes. Therefore, if the same design rule is used, the channel length of the type C TFT must be longer than that of the type A or type B devices. In other words, the channel length and hence the transistor size of the type C device is larger than that of this invention.

Figure 6B:
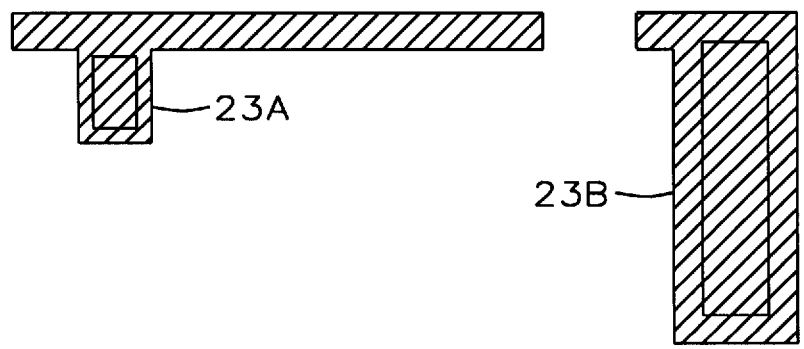
Figure 6C:
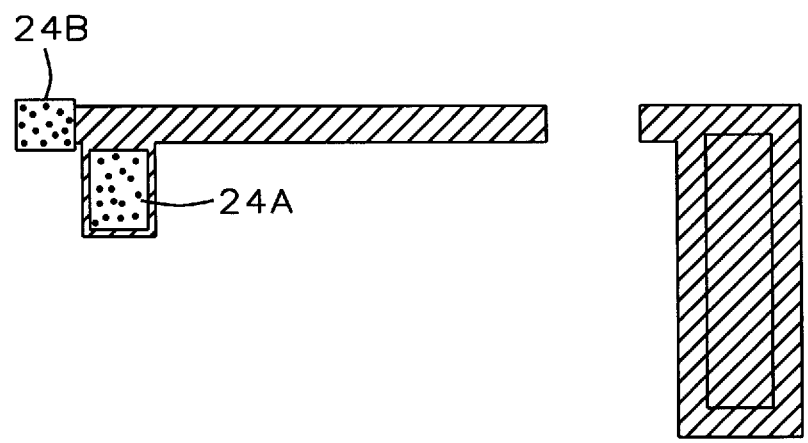
Figure 6D:
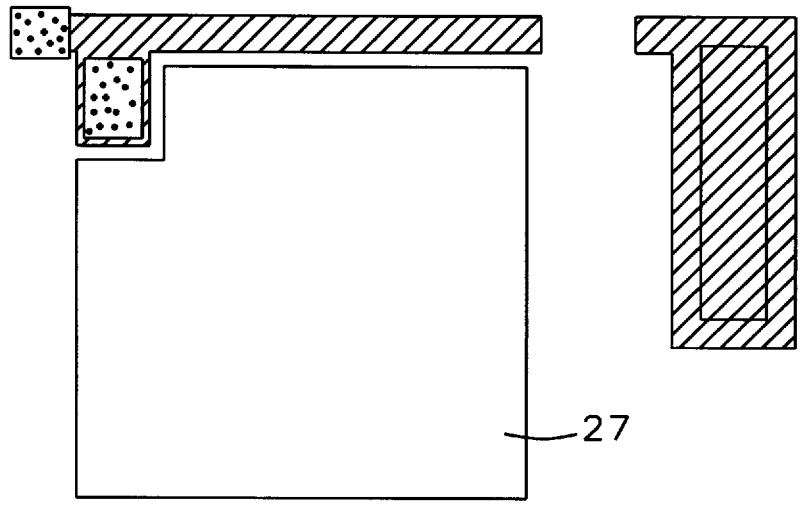
Figure 6E:
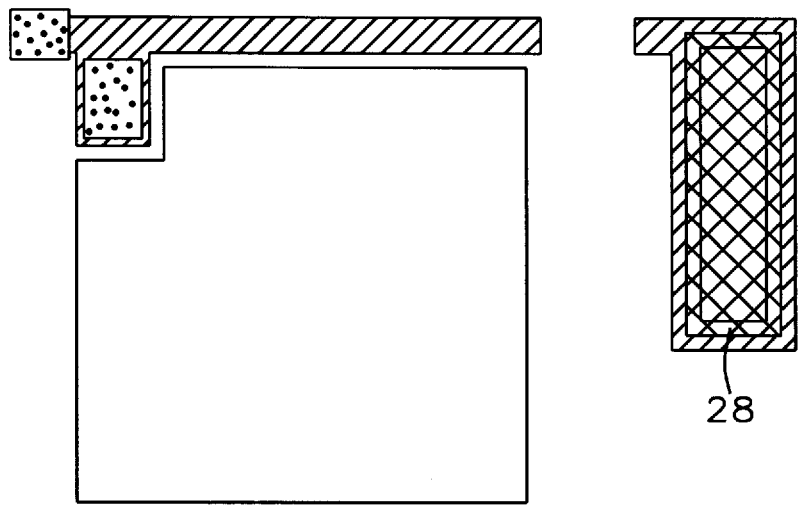
Figure 6F:
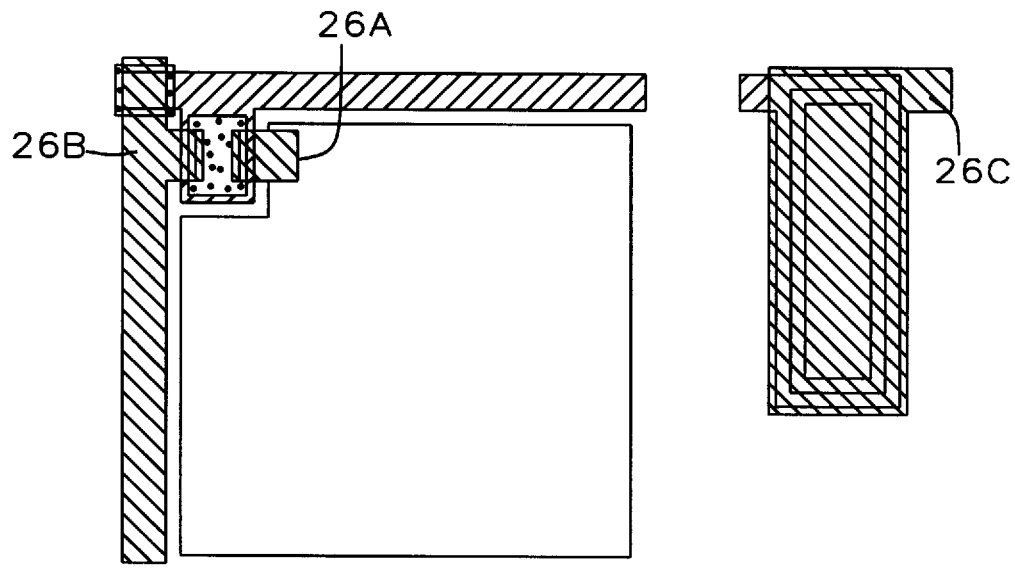
Figure 6G:
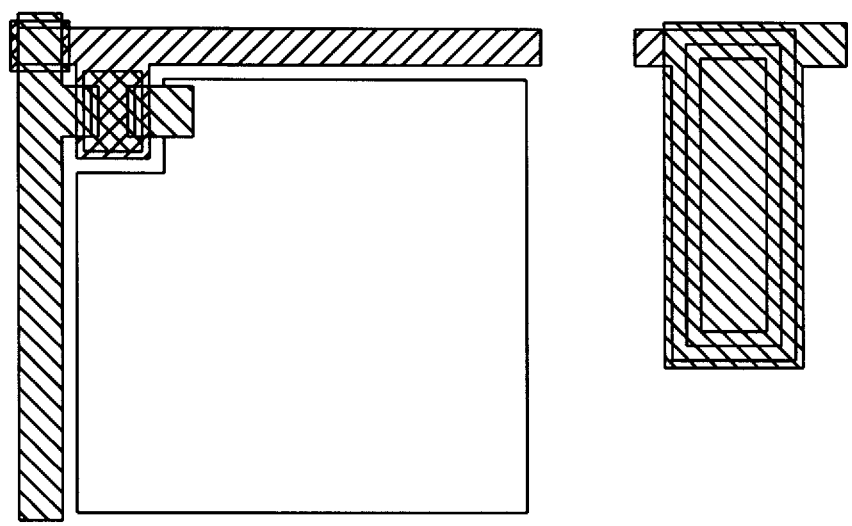
Figure 7A:
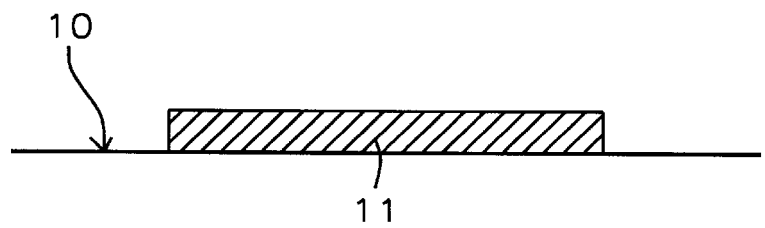
FIGS. 7(A)–7(G) show the process flow of a second embodiment of the present invention.
Figure 7B:
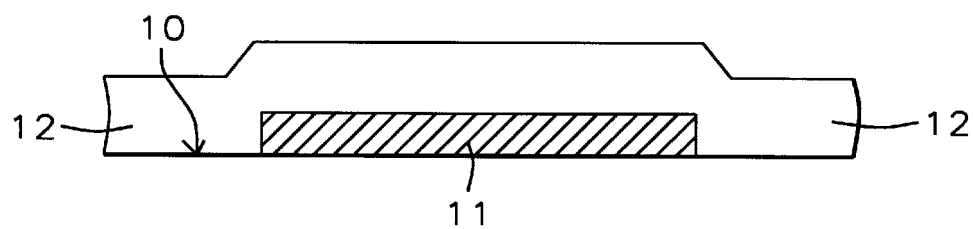
Figure 7C:
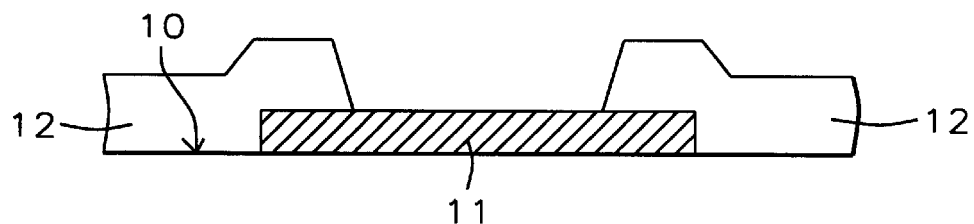
Figure 7D:
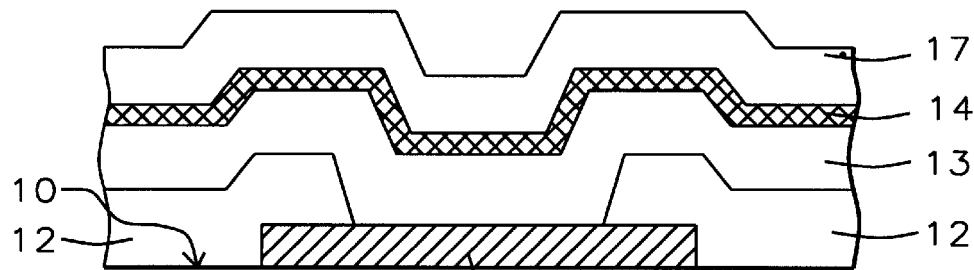
Figure 7E:
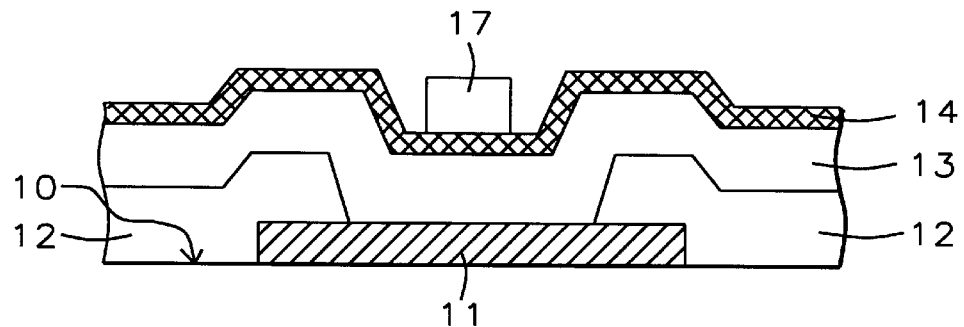
Figure 7F:
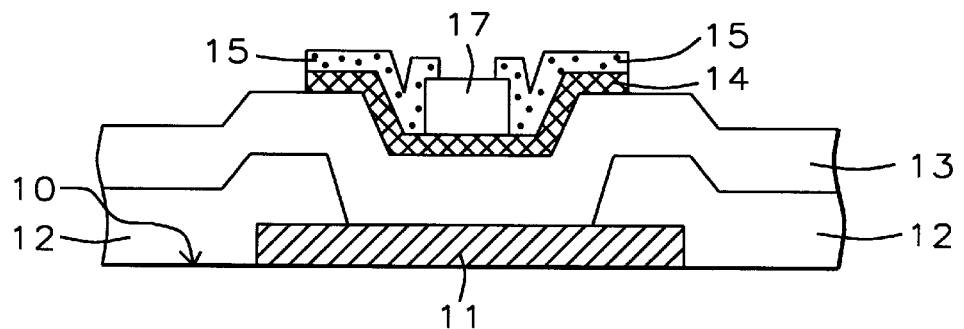
Figure 7G:
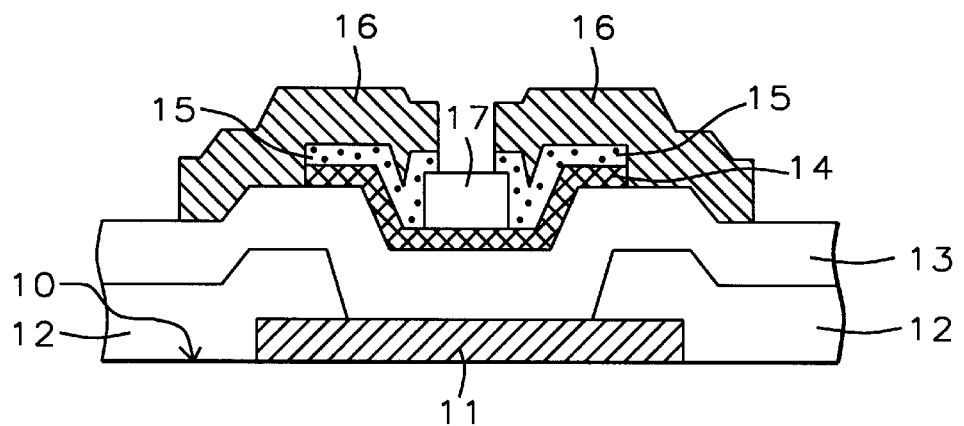
Figure 8A:
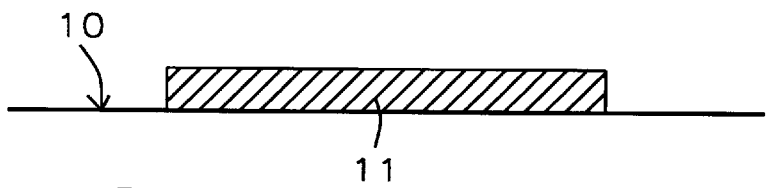
FIGS. 8(A) to 8E shows the first five steps in fabricating a modified TFT structure of the present invention with double-layered gate insulator.
Figure 8B:
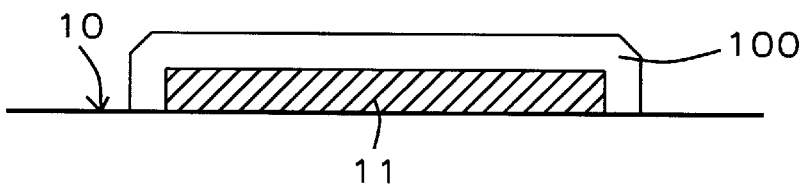
Figure 8C:
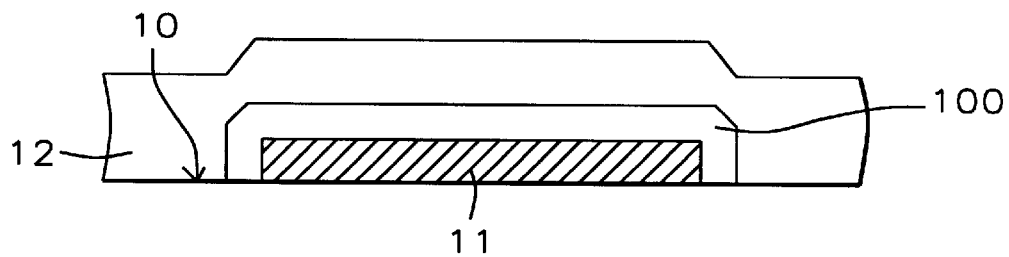
Figure 8D:
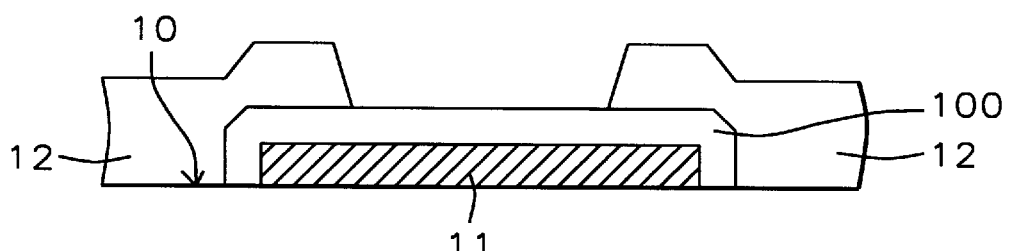
Figure 8E:
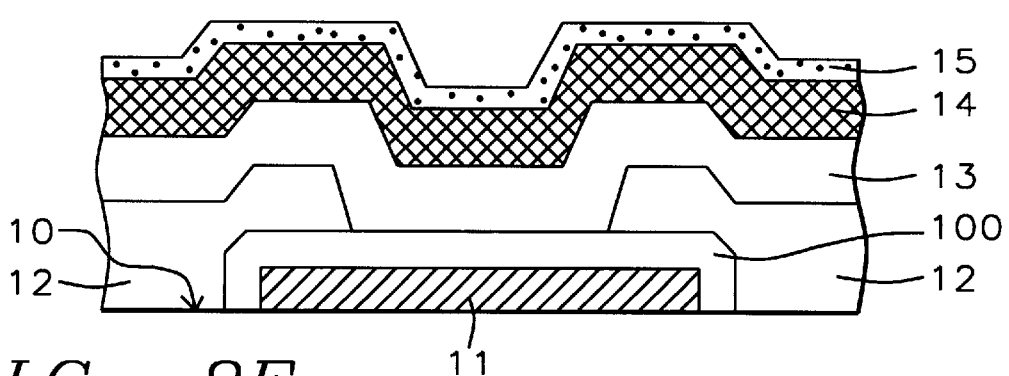
Figure 8F:
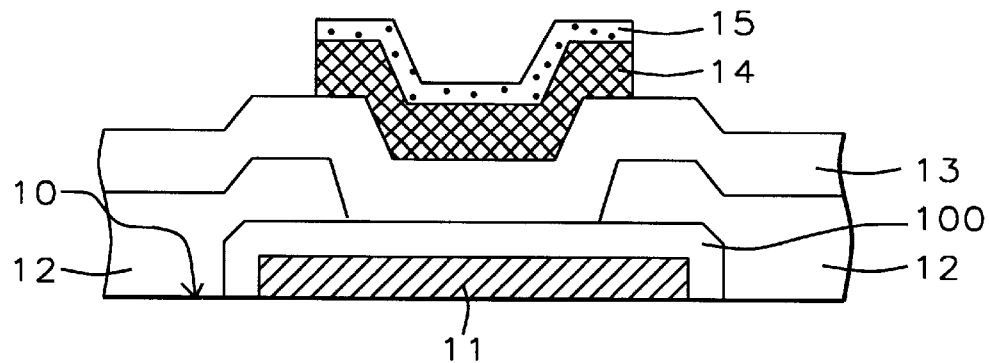
FIGS. 8(F) to 8(H) shows the next three steps in fabricating the modified TFT.
Figure 8G:
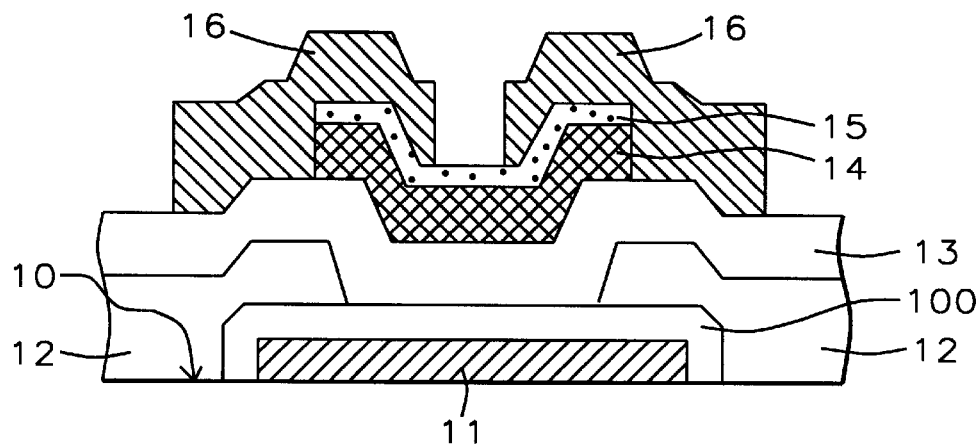
Figure 8H:
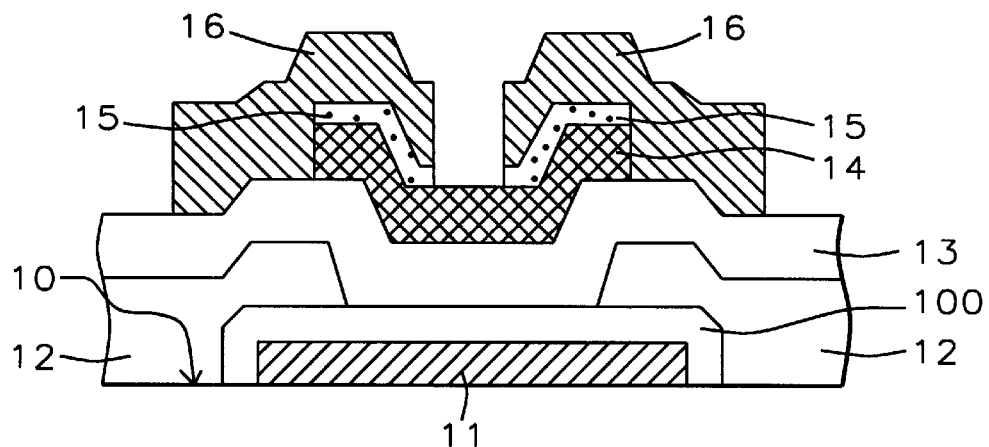
Figure 9A:
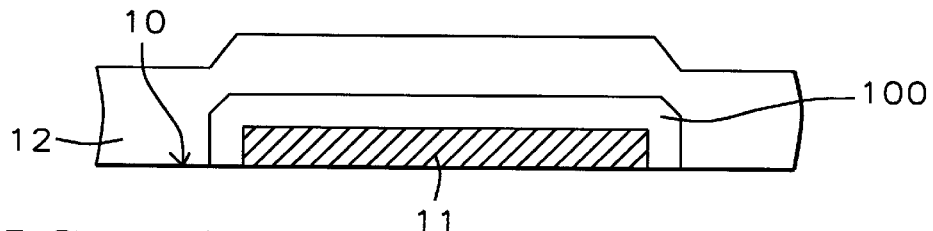
FIGS. 9A to 9D shows the cross-sectional view of the modified contacts of the present invention.
Figure 9B:
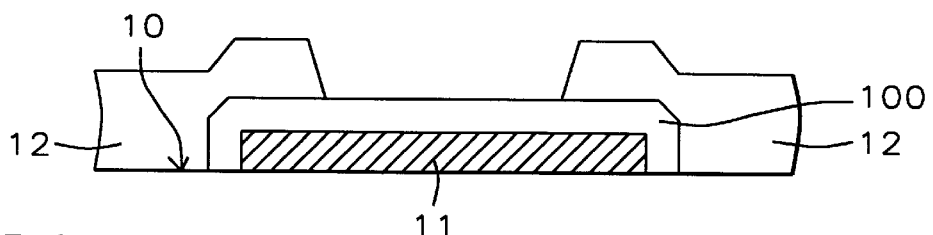
Figure 9C:
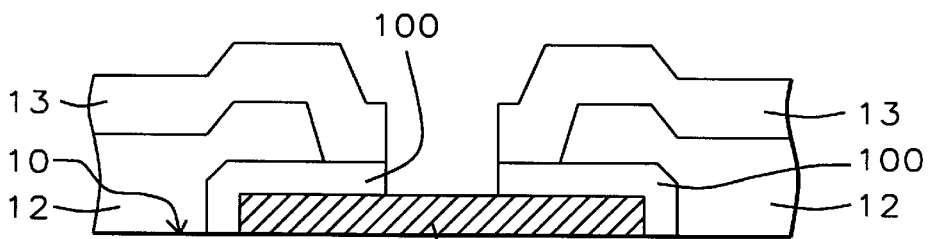
Figure 9D:
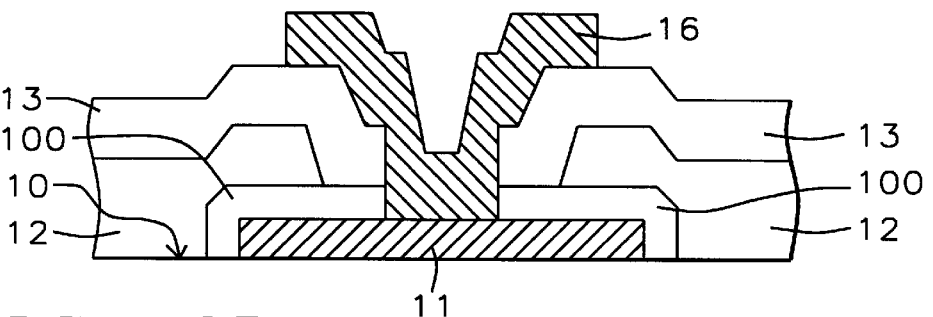

The plan views of each mask layer of this invention are shown in FIGS. 6A to 6G. FIG. 6A shows the first mask to pattern the gate electrode 21A and the scan line 21B. FIG. 6B shows the second mask to pattern the windows 23A, 23B of the first insulating layer for the TFT region and the contact region, respectively. FIG. 6C shows the third mask to pattern the active region 24A of the TFT and the cross-over region 24B of the data line and the scan line. FIG. 6D shows the fourth mask to pattern the transparent pixel electrode 27 of indium tin oxide (ITO). FIG. 6E shows the fifth mask to pattern the contact windows 28. FIG. 6F shows the sixth mask to pattern the source-drain 26A of the TFT and the data line 26B of the panel. The contact metal 26C for the contact window is also defined. Then, as shown in FIG. 6G, the N+ a-Si 24A between the source and the drain electrodes is etched without photo-masking, showing the seventh mask for etching the n+a-Si 24A between the source and the drain electrodes.

FIGS. 8A to 8H show the modified structure of the present invention, in which a double-layered gate insulator is used to reduce gate leakage. The process includes the following steps:

(a) Deposit and pattern a gate electrode 11 on a transparent substrate 10. The preferred material is Ta, Al etc.

(b) Form a first conformal insulating layer 100 on the surface of the gate electrode 11 leaving the remainder of the surface of the substrate exposed. The metal oxide comprises a material such as $Ta_2O_5$ or $Al_2O_3$ can be formed on the surface of the electrode by sputtering of anodization, as explained in a published paper by Y. Nanno et al, High-resolution 6-inch LCD using a-Si TFT with TaOx/SiN+ double insulating layer", *Displays,* Jan. 1990, pp. 36–40, and another paper by Y. Yamamoto et al, "A new a-Si TFT with $Al_2O_3$/SiN Doubled Layered Gate Insulator for 10.4-inch Diagonal Multicolor-Display", 1990 *IEEE International Electron Devices Meeting Proceedings,* pp. 851–854.

(c) Deposit a second, conformal, insulating layer 12 on the substrate 10 and covering the first insulating layer 100.

(d) Deposit and develop a photoresist layer to open a channel window above gate electrode 11 and smaller than the electrode 11 for a channel region of the TFT.

(e) Etch the second insulating layer 12 through the channel window in the photoresist layer until the first insulating layer is bare below the channel window. At the same time, in the second insulating layer over the contact region, holes are opened.

(f) Deposit an a-SiN film 13, an a-Si film 14 and a heavily doped a-Si heavily doped, N+ a-Si semiconductor film 15 on the substrate 10. The films 13, 14 and 15 are conformal.

(g) Etch the n+a-Si and a-Si films except in the active region of the TFT by standard photolithographic processes and dry etching patterning the N+ a-Si film 15 and the a-Si film 14 into a self-aligned island which is not aligned with the gate electrode 11.

(h) Open contact holes of the TFT array through the gate insulator, as shown in FIGS. 9A to 9D, which consists of the a-Si film 13 and the first insulating layer 100 by the standard photolithographic processes.

(i) Form the source and drain contact metal 16 of the TFT.

(j) Etch the n+ a-Si heavily doped amorphous semiconductor film 15 between the source and the drain electrodes by dry etching a hole in the N+ a-Si film 15 above gate electrode 11 forming source/drain regions in N+ a-Si film 15.

FIGS. 7A to 7G show the process flow of a second embodiment of this invention. The cross-over region of this embodiment has three dielectric layers. Thus, the manufacturing yield is higher than the first embodiment, because of the thicker layer. However, this process requires one more mask layer than the first embodiment. The fabrication process is as follows:

(a) Produce the gate electrode 11 on the substrate 10. The preferred material is Cr, Ta, Al etc. Again, if Ta or Al is used as the gate material, metal oxide such as $Ta_2O_5$ or $Al_2O_3$ (not shown in FIG. 7A) can be formed on the surface of the electrode.

(b) Deposit a first insulating layer 12 on the substrate 10.

(c) Deposit and develop a photoresist layer to open a channel window above the gate electrode 11 and smaller than the gate electrode 11 for a channel region of the TFT.

(d) Etch the first insulating layer through the channel window in the photoresist layer until the gate metal is bare blow the channel window. At the same time, the contact holes for the gate electrode and the scan line are opened.

(e) Deposit the a-SiN 13, a-Si 14, and top a-SiN 17 films on the substrate 10. The films 13, 14 and 17 are conformal to the layers below. The function of the top a-SiN film is to passivate the active channel region and serves as the etching stopper during the n+a-Si etching.

(f) Etch the top (Silicon nitride) film 17 forming an etch stop block patterened from a third insulating layer centered over the gate electrode 11. The usual masking is employed, as will be well understood by those skilled in the art, to protect the block during etching.

(g) Deposit a heavily doped a-Si heavily doped N+ a-Si semiconductor film 15 on the substrate 10. The layer 15 is conformal to the structure below.

(h) Etch the N+ a-Si film 15 and a-Si film 14 except the active regions -of the TFT by the standard photolithographic processes patterning the N+ a-Si film 15 and a-Si film 14 into a self-aligned island which is not aligned with the gate electrode 11, and dry etch the N+ a-si film 15 between the source and drain electrodes forming a hole in N+ a-Si film 15 above gate electrode 11 forming source/drain regions in the N+ a-Si film 15.

(i) Open the contact holes of the TFT array through the gate insulator.

(j) form the source and the drain metal 16 of the TFT.

In the foregoing description, amorphous silicon is used as the active semiconductor material, and silicon nitride is used as the insulating layers. It should be understood that other semiconductor and other insulating material can also be used for the TFT structure, and are within the scope of this invention.

What is claimed is:

1. A thin film field effect transistor (TFT) device having an active region with a gate, a source region, a drain region and a channel, and a field region outside said active region, comprising:

a transparent insulating substrate, a metal gate electrode formed on said substrate, said metal gate electrode having edges and having a top surface above said substrate, a first insulating layer covering said substrate and the periphery of said gate electrode with a channel window therethrough over the remainder of said top surface of said gate electrode, said first insulating layer being composed of a material selected from the group consisting of $Al_2O_3$, $CrO_2$, and $TaO_x$, a second insulating layer composed of a-SiN silicon nitride conformally covering both said first insulating layer and extending down into said channel window to cover said remainder of said top surface of said gate electrode and leaving a depression above said channel window, a first semiconductor film formed conformally covering said second insulating layer above said channel window extending down towards said channel window into said depression above said channel window and leaving an intermediate depression above said channel window, said first semiconductor film consisting of amorphous silicon, a second semiconductor film conformally covering said first semiconductor film extending down towards said channel window into said intermediate depression above said channel window and leaving an upper depression above said intermediate depression, said second semiconductor film being composed of heavily doped amorphous silicon, said first and second semiconductor films being patterned into a self-aligned island formed above said gate electrode, said island being aligned with but shorter than said gate electrode along the dimension from said drain region to said source region, said first semiconductor film serving as said channel of said TFT, said second semiconductor film serving as said source region and said drain region of said TFT, and a metal contact layer formed above said second second semiconductor film on the surface thereof, said metal contact layer patterned to form metal contacts for said source and said drain with said metal contacts and with said second semiconductor film being aligned.

2. A TFT device in accordance with claim 1, wherein said gate electrode is composed of a material selected from the group consisting of Al, Cr, Ta and other refractory metals.

3. A TFT device in accordance with claim 1, wherein:

said device includes a contact to said gate electrode spaced away from said source region and said drain region with a first contact window through said first insulating layer down to said gate electrode, said first contact window having sidewalls, said second insulating layer covering both said first insulating layer and extending down through said first contact window to cover the sidewalls of said first contact window and a portion of said gate electrode adjacent to said window, said second insulating layer defining a second contact window, and contact metallization reaching through said first and second contact windows to said top surface of said gate electrode.

4. A TFT device in accordance with claim 1, wherein said gate electrode and said said channel region overlay to form a cross-over.

5. A TFT device in accordance with claim 1, wherein said first insulator and said second insulator are etched through for said metal to make contact with said gate electrode.

6. A TFT device in accordance with claim 1, wherein said first semiconductor film comprises amorphous silicon (a-Si), said second semiconductor film comprises heavily doped a-Si, said gate electrode is composed of a material selected from the group consisting of Al, Cr, Ta and other refractory materials, said first insulating layer is composed of a material selected from the group consisting of $Al_2O_3$, $CrO_2$ and $TaO_x$, and said second insulating layer comprises silicon nitride (a-SiN).

7. A thin film field effect transistor (TFT) device having an active region with a gate, a source region, a drain region and a channel, and a field region outside said active region, comprising:

a transparent insulating substrate, a metal gate electrode formed on said substrate, said gate electrode having first edges and having a first top surface above said substrate, a first insulating layer conformally covering said first top surface and said first edges of said gate electrode, said first insulating layer having a second top surface and having second edges, said first insulating layer being composed of a material selected from the group consisting of $Ta_2O_5$ and $Al_2O_3$, a second insulating layer composed of a different material from said first insulating layer selected from the group consisting of $Al_2O_3$, $CrO_2$, and $TaO_x$, conformally covering said substrate and the periphery of said first insulating layer with a channel window over the remainder of said top surface of said first insulating layer and said gate electrode, a third insulating layer composed of a-SiN silicon nitride conformally covering both said second insulating layer and extending down into said channel window to cover said remainder of said top surface of said first insulating layer and leaving a depression above said channel window, a first semiconductor film formed conformally covering said said third insulating layer above said gate electrode said first semiconductor film extending down towards said channel window into said depression above said channel window and leaving an intermediate depression above said channel window, said first semiconductor film composed of a material consisting of amorphous silicon, a second semiconductor film formed conformally covering said first semiconductor film extending down towards said channel window into said intermediate depression above said channel window and leaving an upper depression above said intermediate depression, said second semiconductor film consisting of heavily doped amorphous silicon, said first and second semiconductor films being patterned into a self-aligned island formed above said gate electrode, said island being aligned with but shorter than said gate electrode along the dimension from said drain region to said source region, said first semiconductor film serving as said channel of said TFT, said second semiconductor film serving as said source region and said drain region of said TFT, a metal contact layer formed above said second second semiconductor film on the surface thereof, said metal contact layer being patterned to form metal contacts for said source region and said drain region with said metal contacts and with said second semiconductor film being self-aligned.

8. A TFT device in accordance with claim 7, wherein said gate electrode is composed of a material selected from the group consisting of tantalum and aluminum, said device includes a contact to said gate electrode spaced away from said source region and said drain region with a first contact window through said first insulating layer down to said top surface of said gate electrode, said second insulating layer covering both said first insulating layer with a second contact window aligned with said first contact window, and contact metallization reaching through said first and second contact windows to said top surface of said gate electrode.

9. A thin film field effect transistor (TFT) device having an active region with a gate, a source region, a drain region and a channel, and a field region outside said active region, comprising:

a transparent insulating substrate, a metal gate electrode formed on said substrate, said gate electrode having edges and having a top surface above said substrate, a first insulating layer conformally covering said substrate and the periphery of said gate electrode with a channel window over the remainder of said top surface of said gate electrode, said first insulating layer being composed of a material selected from the group consisting of $Al_2O_3$, $CrO_2$, and $TaO_x$, a second insulating layer composed of a-SiN silicon nitride conformally covering said first insulating layer and extending down into said channel window to cover said remainder of said top surface of said gate electrode and leaving a depression above said channel window, a first semiconductor film conformally covering said second insulating layer above said gate electrode, said first semiconductor film extending down towards said channel window into said depression above said channel window and leaving an intermediate depression above said channel window, a third insulating layer composed of a-SiN conformally covering said first semiconductor film patterned into a block above said first semiconductor film and said block being centered over said gate electrode, said third insulating layer extending down towards said channel window into said intermediate depression above said channel window, a second semiconductor film conformally covering said block and over said first semiconductor film, said second semiconductor film extending down towards said channel window into said intermediate depression above said channel window aside from said block and leaving upper depression above said intermediate depression about the periphery of said block, said first semiconductor film being composed of a material consisting of amorphous silicon (a-Si), said second semiconductor film being composed of a material consisting of a heavily doped amorphous silicon (a-Si), said first and second semiconductor films being patterned into a self-aligned island formed above said gate electrode, said island being aligned with but shorter than said gate electrode along the dimension from said drain region to said source region, said first semiconductor film serving as said channel of said TFT, said second semiconductor film serving as said source region and said drain region of said TFT, a metal contact layer formed above said second second semiconductor film on the surface thereof, said metal contact layer being patterned to form metal contacts for said source region and said drain region with said metal contacts and with said second semiconductor film being self-aligned.

10. A TFT device in accordance with claim 9 wherein said third insulating layer comprises SiN.

11. A TFT device in accordance with claim 9, wherein said third insulating layer comprises densified SiN.

12. A TFT device in accordance with claim 9, wherein:

said first semiconductor film comprises amorphous silicon (a-Si), said second semiconductor film comprises heavily doped amorphous silicon a-Si, said gate electrode is composed of a material selected from the group consisting of Al, Cr, Ta and other refractory materials, and both said second insulating layer and said third insulating layer comprise silicon nitride (a-SiN).

* * * * *